United States Patent
Sa et al.

(10) Patent No.: US 10,818,649 B2
(45) Date of Patent: Oct. 27, 2020

(54) DISPLAY DEVICE AND METHOD OF FABRICATING THE SAME

(71) Applicant: SAMSUNG ELECTRONICS CO., LTD., Suwon-si (KR)

(72) Inventors: Kongtan Sa, Seoul (KR); Sammook Kang, Hwaseong-si (KR); Yongil Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/415,048

(22) Filed: May 17, 2019

(65) Prior Publication Data

US 2020/0135706 A1 Apr. 30, 2020

(30) Foreign Application Priority Data

Oct. 29, 2018 (KR) .......................... 10-2018-0130073

(51) Int. Cl.
*H01L 25/16* (2006.01)

(52) U.S. Cl.
CPC ................................ *H01L 25/167* (2013.01)

(58) Field of Classification Search
CPC . H01L 25/167; H01L 25/0753; H01L 27/156; G09G 2300/0809
See application file for complete search history.

(56) References Cited

U.S. PATENT DOCUMENTS

| 6,768,534 | B2 | 7/2004 | Iwase et al. |
| 8,805,129 | B2 | 8/2014 | Han et al. |
| 2008/0035948 | A1 | 2/2008 | Shin et al. |
| 2008/0036940 | A1 | 2/2008 | Song et al. |
| 2018/0190672 | A1 | 7/2018 | Lee et al. |
| 2019/0280040 | A1* | 9/2019 | Cheng ............... H01L 27/14623 |
| 2020/0105826 | A1* | 4/2020 | Kim ................... H01L 25/0753 |

FOREIGN PATENT DOCUMENTS

KR  10-2012-0014084 A  2/2012

* cited by examiner

*Primary Examiner* — Joseph C. Nicely
(74) *Attorney, Agent, or Firm* — Sughrue Mion, PLLC

(57) ABSTRACT

Display devices and methods of fabricating display devices are provided. The display device includes a circuit board; a first light-emitting device array substrate mounted on the circuit board; and a second light-emitting device array substrate mounted on the circuit board adjacent the first light-emitting device array substrate in a first direction. The circuit board defines a groove that overlaps a boundary between the first light-emitting device array substrate and the second light-emitting device array substrate.

20 Claims, 16 Drawing Sheets

DISPLAY DEVICE AND METHOD OF FABRICATING THE SAME

CROSS-REFERENCE TO RELATED APPLICATION

This application claims priority from Korean Patent Application No. 10-2018-0130073, filed on Oct. 29, 2018 in the Korean Intellectual Property Office, the contents of which are incorporated herein by reference in its entirety.

BACKGROUND

Methods and apparatuses consistent with example embodiments relate to a display device and a method of fabricating the same.

A display device may be used in various multimedia apparatus such as televisions, mobile phones, navigators, computer monitors, and game consoles. The display devices generate images. The display devices include, when viewed in front, a display region on which images are displayed and a non-display region on which no images are displayed. As the non-display region is reduced, wider images may be displayed on the display region.

SUMMARY

One or more example embodiments provide a display device with enhanced reliability.

One or more example embodiments provide a method of fabricating a display device, in which method process defects are reduced and process yields are increased.

According to an aspect of an example embodiment, there is provided a display device including a circuit board; a first light-emitting device array substrate mounted on the circuit board; and a second light-emitting device array substrate mounted on the circuit board adjacent the first light-emitting device array substrate in a first direction. The circuit board defines a groove that overlaps a boundary between the first light-emitting device array substrate and the second light-emitting device array substrate.

According to an aspect of an example embodiment, there is provided a display device including a base substrate; a first substrate mounted on the base substrate; and a second substrate mounted on the base substrate. The first substrate and the second substrate are linearly disposed along a first direction, and the base substrate defines a groove that overlaps a boundary between the first substrate and the second substrate.

According to an aspect of an example embodiment, there is provided a display device including a circuit board; a first light-emitting device array substrate that is flip-chip mounted on the circuit board; a second light-emitting device array substrate that is flip-chip mounted on the circuit board, wherein the first light-emitting device array substrate and the second light-emitting device array substrate are linearly disposed along a first direction; and a non-conductive layer interposed between the circuit board and each of the first light-emitting device array substrate and the second light-emitting device array substrate. The circuit board defines a groove that overlaps a boundary between the first light-emitting device array substrate and the second light-emitting device array substrate, and the non-conductive layer is provided within the groove.

DETAILED DESCRIPTION

Example embodiments will now be described in detail with reference to the accompanying drawings.

Figure 1:
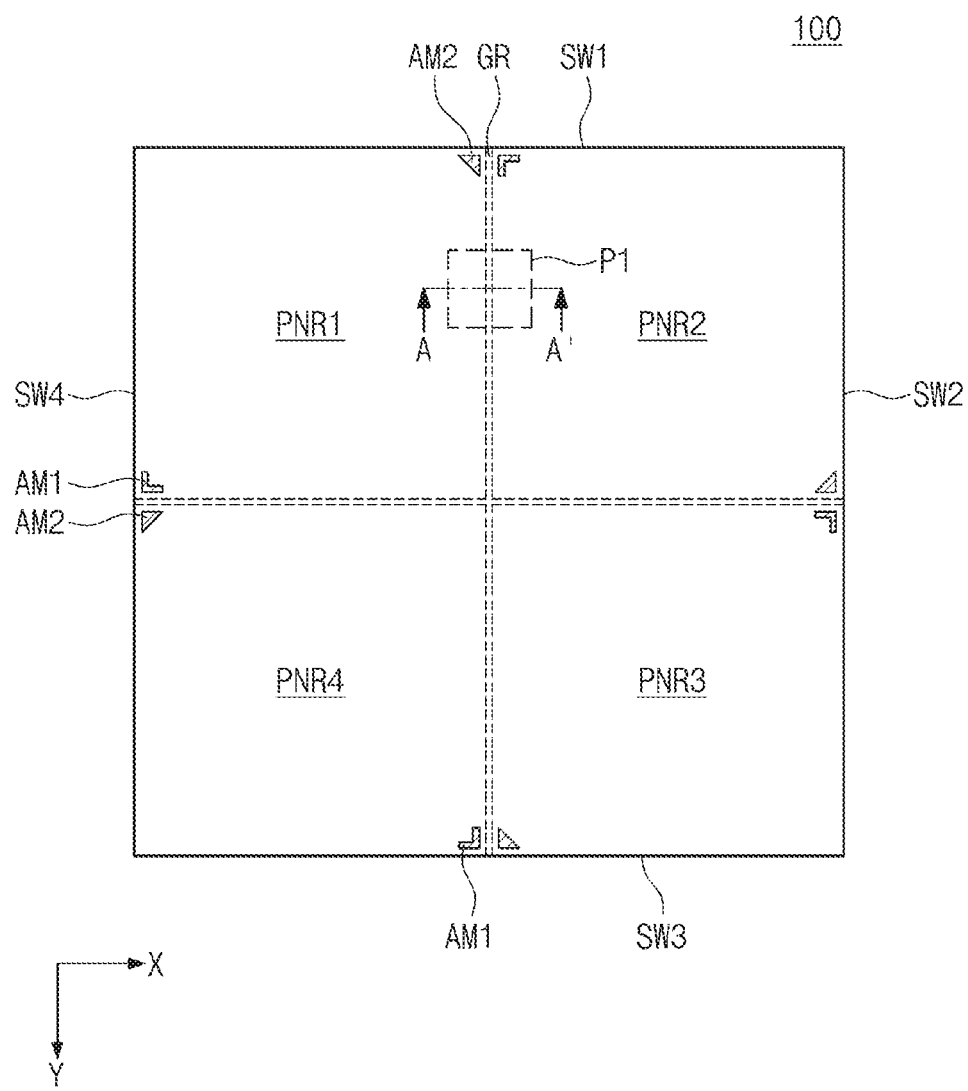
FIG. 1 illustrates a plan view of a circuit board according to one or more example embodiments.
Figure 2:
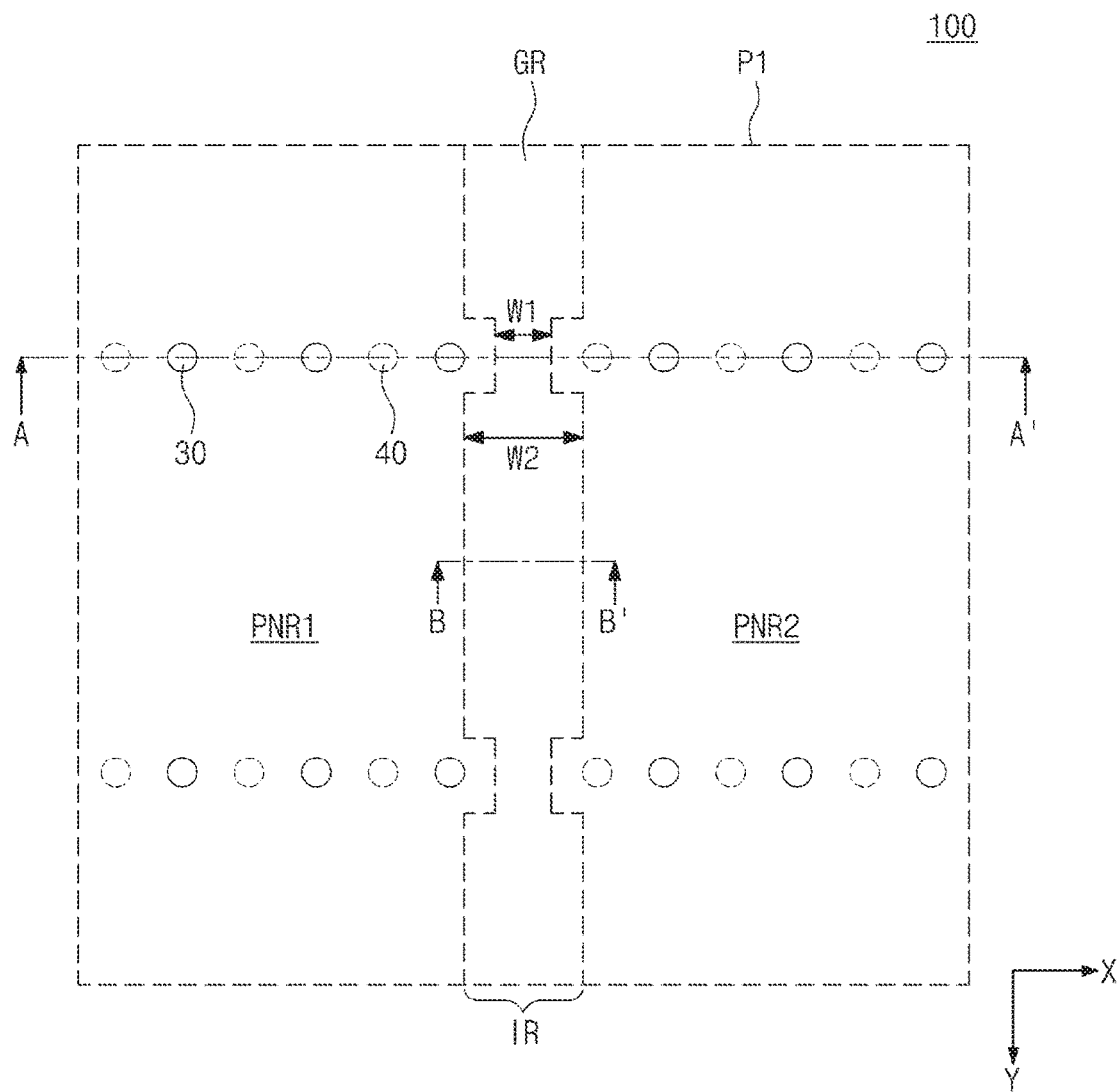
FIG. 2 illustrates an enlarged view showing section P1 of FIG. 1.
Figure 3:
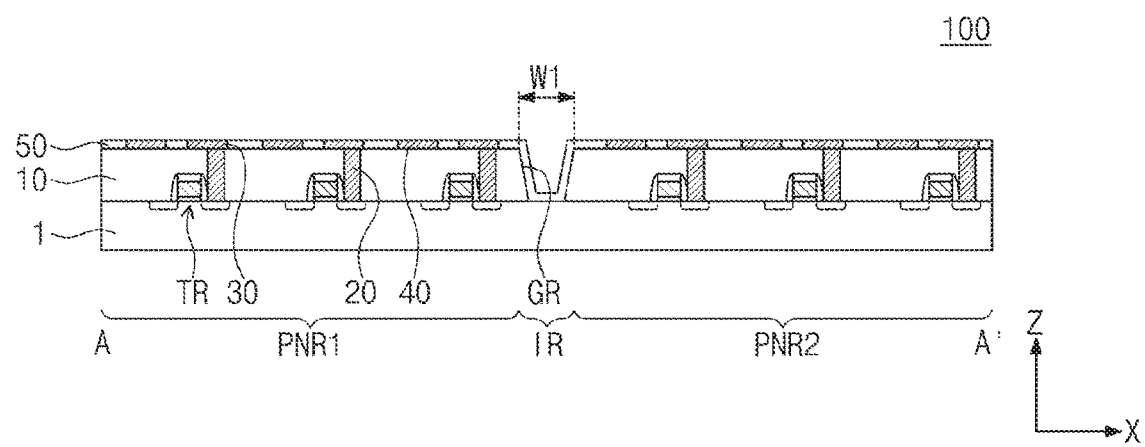
FIG. 3 illustrates a cross-sectional view along line A-A' of FIG. 2.
Figure 4:
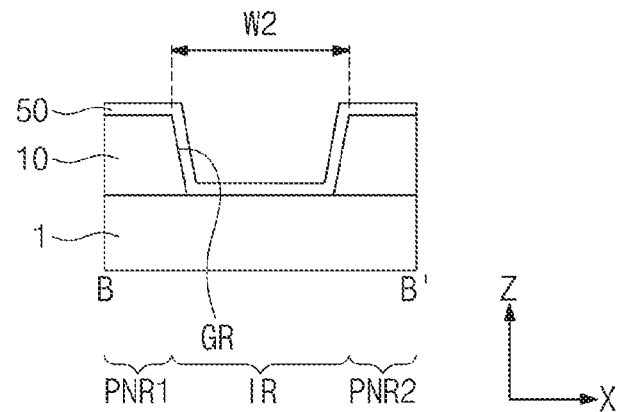
FIG. 4 illustrates a cross-sectional view along line B-B' of FIG. 2.

FIG. 1 illustrates a plan view showing a circuit board according to one or more example embodiments. FIG. 2 illustrates an enlarged view showing section P1 of FIG. 1. FIG. 3 illustrates a cross-sectional view along line A-A' of FIG. 2. FIG. 4 illustrates a cross-sectional view along line B-B' of FIG. 2.

Referring to FIGS. 1 to 4, a circuit board 100 according to one or more example embodiments may include a first panel region PNR1, a second panel region PNR2, a third panel region PNR3, and a fourth panel region PNR4 that are disposed along a clockwise direction. The first panel region PNR1 and the second panel region PNR2 may be linearly placed along a first direction X. The third panel region PNR3 may be adjacent, in a second direction Y, to the second panel region PNR2, which second direction Y intersects the first direction X. The fourth panel region PNR4 may be adjacent, in the second direction Y, to the first panel region PNR1.

The circuit board 100 may have a first sidewall SW1, a second sidewall SW2, a third sidewall SW3, and a fourth sidewall SW4 that are disposed along the clockwise direction. The circuit board 100 may include first circuit alignment keys AM1 and second circuit alignment keys AM2. The first circuit alignment keys AM1 may have shapes different from those of the second circuit alignment keys AM2. For example, when viewed in plan, the first circuit alignment key AM1 may have an upright or rotated "L" shape, and the second circuit alignment key AM2 may have a triangular shape. The first circuit alignment keys AM1 and the second circuit alignment keys AM2 may be placed along the perimeter of the circuit board 100. For example, the first circuit alignment keys AM1 and the second circuit alignment keys AM2 may not be placed on a central area of the circuit board 100.

On one of the first to fourth panel regions PNR1 to PNR4, a single first circuit alignment key AM1 and a single second circuit alignment key AM2 may be diagonally positioned on the panel region. For example, the first circuit alignment key AM1 may be located on a front left corner of the first panel region PNR1. The second circuit alignment key AM2 may be located on a rear right corner of the first panel region PNR1. On the second panel region PNR2, the first circuit alignment key AM1 may be located on a rear left corner and the second circuit alignment key AM2 may be located on a front right corner. On the third panel region PNR3, the first circuit alignment key AM1 may be located on a rear right corner and the second circuit alignment key AM2 may be located on a front left corner. On the fourth panel region PNR4, the first circuit alignment key AM1 may be located on a front right corner and the second circuit alignment key AM2 may be located on a rear left corner. The first circuit alignment key AM1 on one of the first to fourth panel regions PNR1 to PNR4 may pair with the second circuit alignment key AM2 on a neighboring one of the first to fourth panel regions PNR1 to PNR4. A pair of the first and second circuit alignment keys AM1 and AM2 may be disposed close to the middle (or center) of one of the first to fourth sidewalls SW1 to SW4.

Referring to FIGS. 1 and 2, the circuit board 100 may include a groove GR. The groove GR may be positioned among the first to fourth panel regions PNR1 to PNR4. The groove GR may have a cross shape when viewed in plan. The groove GR may have different widths W1 and W2 depending positions.

Referring to FIGS. 1 to 4, the circuit board 100 may include a base layer 1. The base layer 1 may be a semiconductor substrate, for example, a silicon substrate. A plurality of transistors TR may be disposed on the base layer 1. The transistors TR may be covered with an interlayer dielectric layer 10. The interlayer dielectric layer 10 may be formed of one or more of a silicon nitride layer, a silicon oxide layer, and a silicon oxynitride layer. Contact plugs 20 may be provided within interlayer dielectric layer 10, and the contact plugs 20 may be coupled to the transistors TR. The interlayer dielectric layer 10 may be provided thereon with first conductive pads 30 electrically connected to the transistors TR. The interlayer dielectric layer 10 may also be provided thereon with second conductive pads 40. The first conductive pads 30 and the second conductive pads 40 may be alternately disposed along the first direction X. The second conductive pads 40 may be electrically connected to a ground line. The interlayer dielectric layer 10 may be covered with a first passivation layer 50. The first passivation layer 50 may be formed of polyimide or silicon nitride. The base layer 1, the transistors TR, the interlayer dielectric layer 10, the first conductive pads 30, the second conductive pads 40, and the first passivation layer 50 may be disposed on all of the first to fourth panel regions PNR1 to PNR4.

The groove GR may be formed in the interlayer dielectric layer 10 along a boundary IR among the first to fourth panel regions PNR1 to PNR4. The groove GR may expose the base layer 1. The first passivation layer 50 may cover an inner wall and a bottom surface of the groove GR. The widths W1 and W2 of the groove GR, which are parallel to the first direction X, may vary, and may be different at various positions. For example, the groove GR may have a first width W1 at a first position between one of the first conductive pads 30 that is most adjacent to the boundary IR and one of the second conductive pads 40 that is most adjacent to the boundary IR. The groove GR may have a second width W2 at a second position spaced apart from the first position. The second width W2 may be greater than the first width W1.

The first and second circuit alignment keys AM1 and AM2 may be formed of the same material at the same height as that of the first conductive pads 30. Alternatively, the first and second circuit alignment keys AM1 and AM2 may be formed of the same material at the same height as that of a gate electrode constituting the transistor TR.

Figure 5:
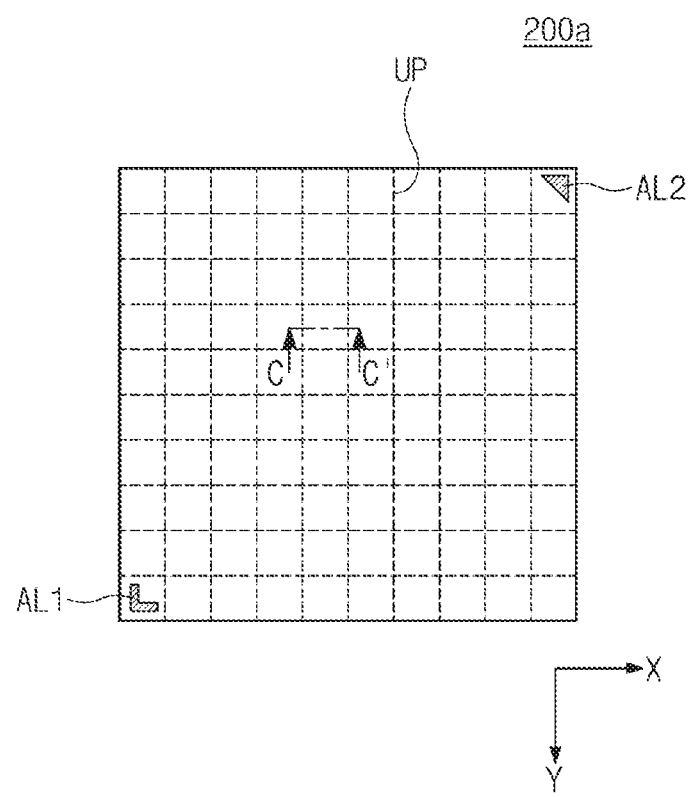
FIG. 5 illustrates a plan view showing a light-emitting device array substrate according to one or more example embodiments.
Figure 6:
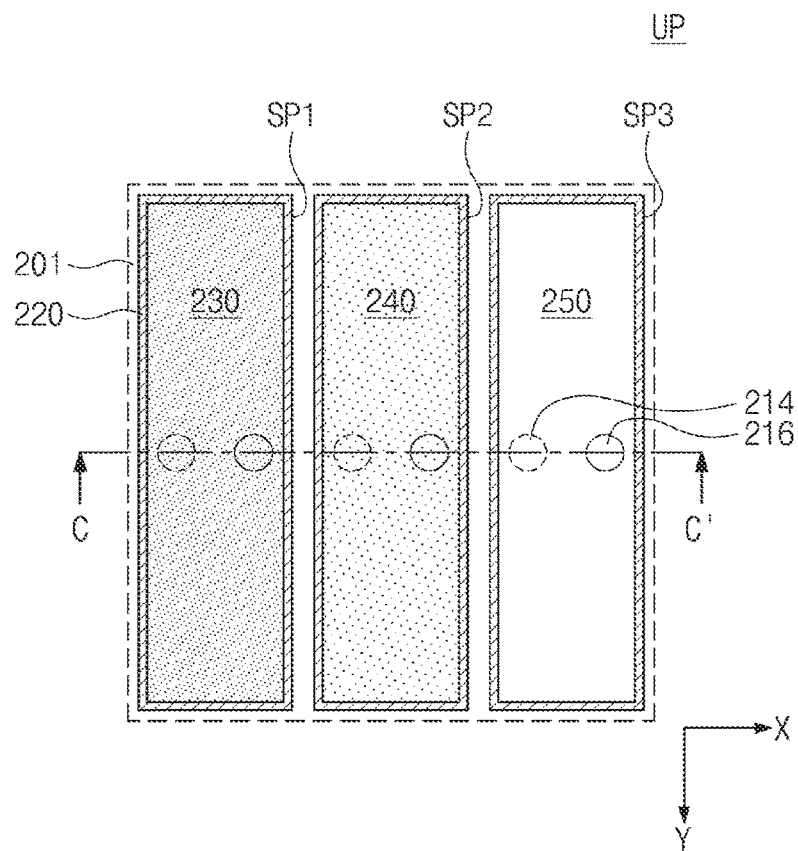
FIG. 6 illustrates a plan view showing a unit pixel region of the light-emitting device array substrate of FIG. 5.
Figure 7:
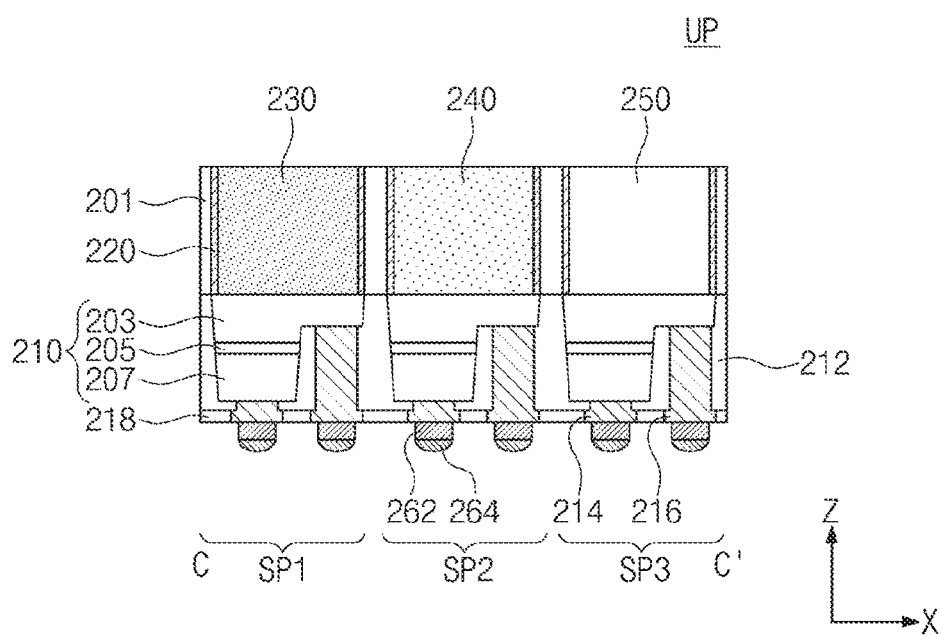
FIG. 7 illustrates a cross-sectional view along line C-C' of FIG. 5 or 6.

FIG. 5 illustrates a plan view showing a light-emitting device array substrate according to one or more example embodiments. FIG. 6 illustrates a plan view showing a unit pixel region of the light-emitting device array substrate of FIG. 5. FIG. 7 illustrates a cross-sectional view along line C-C' of FIG. 5 or 6.

Referring to FIGS. 5 to 7, a light-emitting device array substrate 200a may include a plurality of unit pixel regions UP that are arranged. Each of the unit pixel regions UP may include a first sub-pixel region SP1, a second sub-pixel region SP2, and a third sub-pixel region SP3. The first, second, and third sub-pixel regions SP1, SP2, and SP3 may produce different colors from each other.

A light-emitting stack 210 may be disposed on each of the first, second, and third sub-pixel regions SP1, SP2, and SP3. The light-emitting stack 210 may include a first-conductivity semiconductor layer 203, a second-conductivity semiconductor layer 207 spaced apart from the first-conductivity semiconductor layer 203, and an active layer 205 interposed between the first-conductivity and second-conductivity semiconductor layers 203 and 207. For example, the first-conductivity semiconductor layer 203 may be N-type, and the second-conductivity semiconductor layer 207 may be P-type.

The first-conductivity semiconductor layer 203 may be a nitride semiconductor layer composed of n-type $In_xAl_yGa_{1-x-y}N$ ($0 \leq x \leq 1$, $0 \leq y \leq 1$, $0 \leq x+y \leq 1$) in which an n-type impurity such as silicon (Si) is doped. For example, the first-conductivity semiconductor layer 203 may include GaN containing an n-type impurity.

In one or more example embodiments, the first-conductivity semiconductor layer 203 may include a first-conductivity semiconductor contact layer and a current diffusion layer. The first-conductivity semiconductor contact layer may have an impurity concentration in the range of about $2 \times 10^{18}$ atoms/cm$^3$ to about $9 \times 10^{19}$ atoms/cm$^3$. The first-conductivity semiconductor contact layer may have a thickness of about 1 µm to about 5 µm. The current diffusion layer may have a structure in which a plurality of $In_xAl_yGa_{1-x-y}N$ ($0 \leq x \leq 1$, $0 \leq y \leq 1$, $0 \leq x+y \leq 1$) layers, whose compositions or impurity contents are different from each other, are alternately stacked. For example, the current diffusion layer may have an n-type superlattice structure in which are alternately stacked an n-type GaN layer and/or an $Al_xIn_yGa_zN$ layer ($0 \leq x \leq 1$, $0 \leq y \leq 1$, $0 \leq z \leq 1$, $x+y+z \neq 0$) each of which layers has a thickness of about 1 nm to about 500 nm. The current diffusion layer may have an impurity concentration in the range of about $2\times10^{18}$ atoms/cm$^3$ to about $9\times10^{19}$ atoms/cm$^3$.

The active layer 205 may be interposed between the first-conductivity semiconductor layer 203 and the second-conductivity semiconductor layer 207, and may emit a light having an energy caused by recombination of electrons and holes. The active layer 205 may have a multi-quantum well (MQW) structure in which at least one quantum well layer and at least one quantum barrier layer are alternately stacked. For example, the quantum well layer and the quantum barrier layer may include different compositions of $In_xAl_yGa_{1-x-y}N$ ($0 \leq x \leq 1$, $0 \leq y \leq 1$, $0 \leq x+y \leq 1$). For another example, the quantum well layer may include $In_xGa_{1-x}N$ ($0 \leq x \leq 1$), and the quantum barrier layer may include GaN or AlGaN. Each of the quantum well layer and the quantum barrier layer may have a thickness in the range of about 1 nm to about 50 nm. The active layer 205 may have a single quantum well structure instead of the multi-quantum well structure.

The second-conductivity semiconductor layer 207 may be a nitride semiconductor layer composed of p-type $In_xAl_yGa_{1-x-y}N$ ($0 \leq x \leq 1$, $0 \leq y \leq 1$, $0 \leq x+y \leq 1$) in which a p-type impurity, such as magnesium (Mg), is doped.

In one or more example embodiments, the second-conductivity semiconductor layer 207 may include an electron blocking layer, a lightly-doped p-type GaN layer, and a heavily-doped p-type GaN layer that serves as a contact layer. For example, the electron blocking layer may have either a single structure composed of $Al_yGa_{1-y}N$ ($0 \leq y \leq 1$), or a structure in which a plurality of $In_xAl_yGa_{1-x-y}N$ ($0 \leq x \leq 1$, $0 \leq y \leq 1$, $0 \leq x+y \leq 1$) layers are alternately stacked, each of which has a thickness of about 5 nm to about 100 nm and whose compositions or impurity contents are different from each other. The electron blocking layer may have an energy band gap that decreases as distance from the active layer 205 increases. The electron blocking layer may have an aluminum (Al) composition that decreases as distance from the active layer 205 increases.

The first-conductivity semiconductor layer 203 may laterally protrude in the first direction X more than the second-conductivity semiconductor layer 207 and the active layer 205. An isolation dielectric pattern 212 may separate the light-emitting stacks 210, that are provided on the first to third sub-pixel regions SP1, SP2, and SP3, from each other. The isolation dielectric pattern 212 may be formed to have a single or multiple layers including, for example, one or more of a silicon oxide layer, a silicon nitride layer, and a silicon oxynitride layer. A bottom surface of the isolation dielectric pattern 212 may be covered with a second passivation layer 218. The second passivation layer 218 may be formed of, for example, polyimide or silicon nitride.

The first-conductivity semiconductor layer 203 may be in contact with a first electrode 216 that penetrates the second passivation layer 218 and the isolation dielectric pattern 212. The second-conductivity semiconductor layer 207 may be in contact with a second electrode 214 that penetrates the second passivation layer 218 and the isolation dielectric pattern 212. The first electrode 216 and the second electrode 214 may include metal, such as aluminum, tungsten, or copper. In one or more example embodiments, the first electrodes 216 and the second electrodes 214 may be alternately arranged along the first direction X.

The first electrodes 216 and the second electrodes 214 may contact corresponding first connectors 262. The first connectors 262 may be, for example, conductive bumps. The first connectors 262 may include, for example, copper. The first connectors 262 may contact corresponding second connectors 264. The second connectors 264 may be, for example, solder balls that include tin.

A partition wall structure 201 may be disposed on the isolation dielectric pattern 212 between the first, second, and third sub-pixel regions SP1, SP2, and SP3. The partition wall structure 201 may include a semiconductor material or a dielectric material. The partition wall structure 201 may include, for example, silicon or sapphire. The partition wall structure 201 may have a network or grid shape when viewed in plan. A reflective layer 220 may be disposed on a sidewall of the partition wall structure 201. The reflective layer 220 may include, for example, metal. A laterally incident light may be reflected by the reflective layer 220 and then may be incident on a corresponding one of the first to third sub-pixel regions SP1, SP2, and SP3. The reflective layer 220 may prevent crosstalk between neighboring ones of the first to third sub-pixel regions SP1, SP2, and SP3.

On each of the first to third sub-pixel regions SP1, SP2, and SP3, the light-emitting stack 210 may be provided thereon with a corresponding one of light-transmission parts 230, 240, and 250. The light-transmission parts 230, 240, and 250 may include a first light-transmission part 230, a second light-transmission part 240, and a third light-transmission part 250. The first light-transmission part 230 may be disposed on the first sub-pixel region SP1. The second light-transmission part 240 may be disposed on the second sub-pixel region SP2. The third light-transmission part 250 may be disposed on the third sub-pixel region SP3.

At least two of the first to third light-transmission parts 230, 240, and 250 may convert a light of a first wavelength produced from the light-emitting stack 210 into a light of a second wavelength different from the first wavelength. One of the first to third light-transmission parts 230, 240, and 250 may be transparent, and a light produced from the light-emitting stack 210 may be allowed to pass through the transparent one of the first to third light-transmission parts 230, 240, and 250. At least two of the first to third light-transmission parts 230, 240, and 250 may include a material capable of converting a light produced from the light-emitting stack 210 into a light having a desirable color. For example, the light-emitting stack 210 may produce a blue-colored light, one of the first to third light-transmission parts 230, 240, and 350 may convert the blue-colored light into a red-colored light, and another of the first to third light-transmission parts 230, 240, and 250 may convert the blue-colored light into a green-colored light. At least two of the first to third light-transmission parts 230, 240, and 250 may include a fluorescent material and/or a quantum dot material.

In one or more example embodiments, the fluorescent material may include oxide, silicate, nitride, or fluorite, and may have various compositions and colors. For example, the fluorescent material may include β-SiAlON:Eu$^{2+}$ (green color), (Ca,Sr)AlSiN$_3$:Eu$^{2+}$ (red color), La$_3$Si$_6$N$_{11}$:Ce$^{3+}$ (yellow color), K$_2$SiF$_6$:Mn$_4^+$ (red color), SrLiAl$_3$N$_4$:Eu (red color), Ln$_{4-x}$(Eu$_z$M$_{1-z}$)$_x$Si$_{12-y}$Al$_y$O$_{3+x+y}$N$_{18-x-y}$ ($0.5 \leq x \leq 3$, $0 \leq z \leq 0.3$, $0 \leq y \leq 4$) (red color), K$_2$TiF$_6$:Mn$_4^+$ (red color), NaYF$_4$:Mn$_4^+$ (red color), or NaGdF$_4$:Mn$_4^+$ (red color). However, the fluorescent material is not limited to those kinds discussed above.

In one or more example embodiments, the quantum dot material may include a III-V or II-VI compound having a core-shell structure, for example, a core such as CdSe or InP and a shell such as ZnS or ZnSe. In addition, the quantum dot material may include a ligand to increase stability of the core and the shell.

Referring to FIG. 5, the light-emitting device array substrate 200a may include a first array alignment key AL1 and a second array alignment key AL2 that are adjacent to opposite corners of the light-emitting device array substrate 200a. The first array alignment key AL1 may be disposed on the unit pixel region UP that is positioned, for example, on a front left corner of the light-emitting device array substrate 200a. The second array alignment key AL2 may be disposed on the unit pixel region UP that is positioned, for example, on a rear right corner of the light-emitting device array substrate 200a. The first array alignment key AL1 may have, for example, an "L" shape when viewed in plan. The second array alignment key AL2 may have, for example, a triangular shape when viewed in plan. The first and second array alignment keys AL1 and AL2 may be formed of the same material at the same height as that of an end of the first electrode 216 or that of an end of the second electrode 214.

According to one or more example embodiments, a method of fabricating a display device may use a tiling scheme in which the circuit board 100 is mounted thereon with a plurality of the light-emitting device array substrates 200a each of which has a size less than that of the circuit board 100. This will be further discussed in detail below. In comparison with a case in which a single large-sized light-emitting device array substrate is mounted on a circuit board, the tiling scheme may need no increase in pressure during a thermal compression bonding process, and as a result, may proceed within the capability of process equipment. In addition, when any one of light-emitting array substrates is defective, it may be enough to change only the defective substrate and thus a process yield may be increased. It may be difficult to produce a large-sized light-emitting device array substrate using existing fabrication processes, such as photolithography. Thus, it may be more efficient to product a small-sized light-emitting device array substrate using the existing fabrication process.

Figure 8:
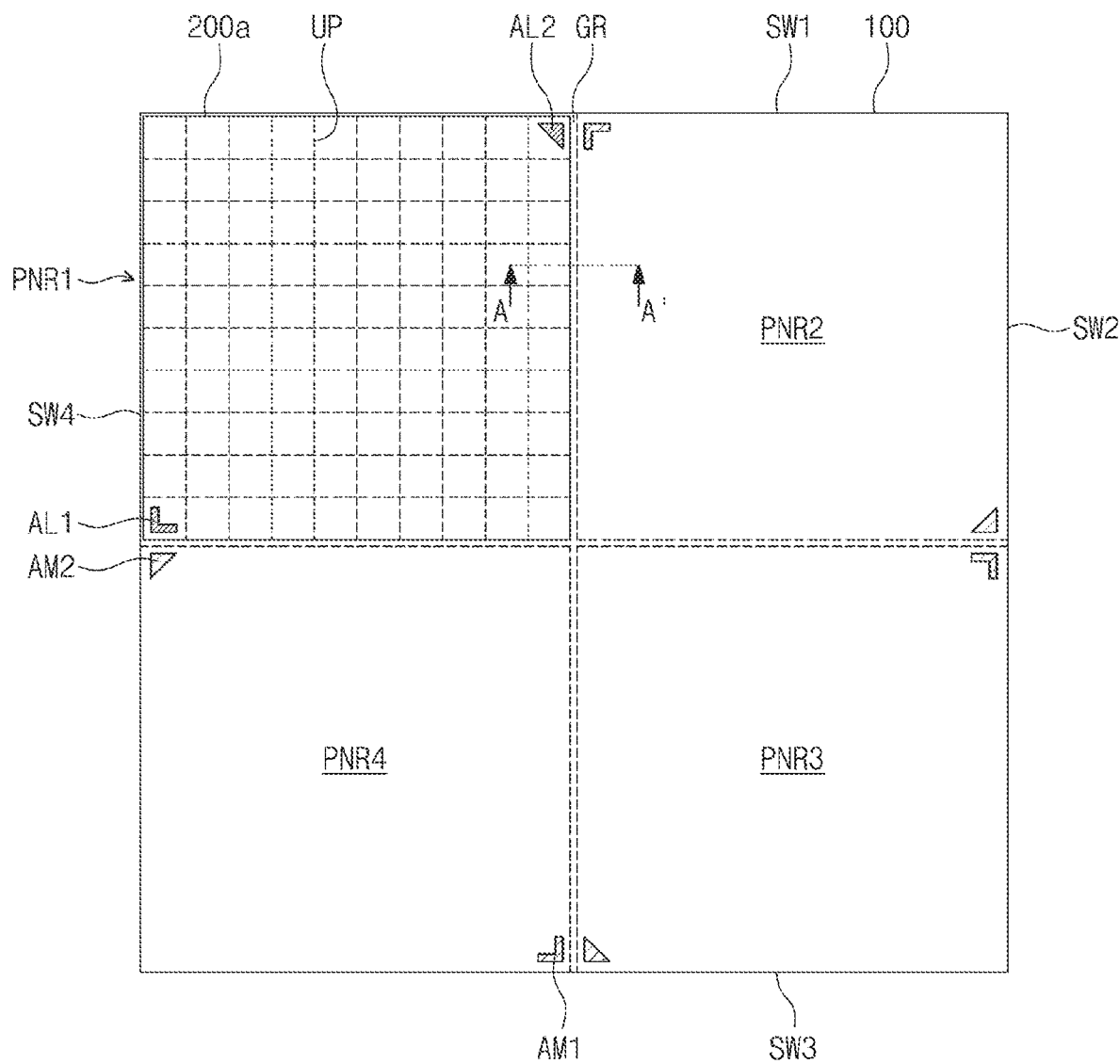
FIG. 8 illustrates a cross-sectional view showing a method of fabricating a display device according to one or more example embodiments.
Figure 9:
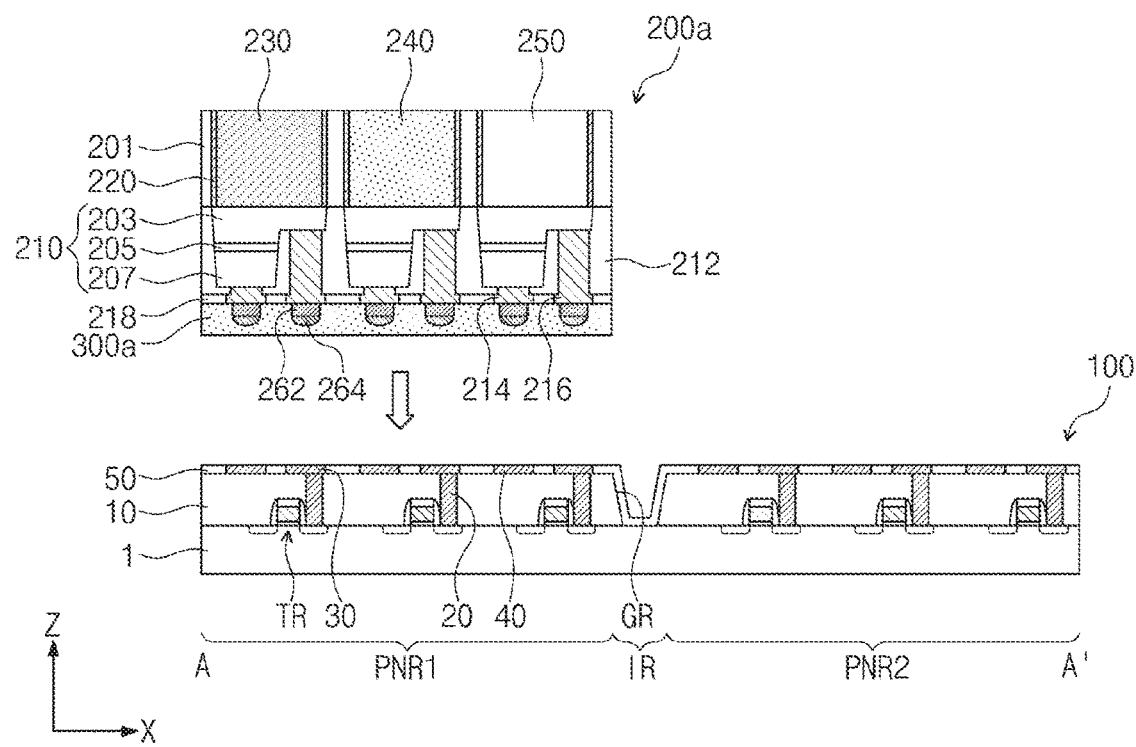
FIGS. 9 and 10 illustrate cross-sectional views along line A-A' of FIG. 8, showing a method of fabricating a display device according to one or more example embodiments.
Figure 10:
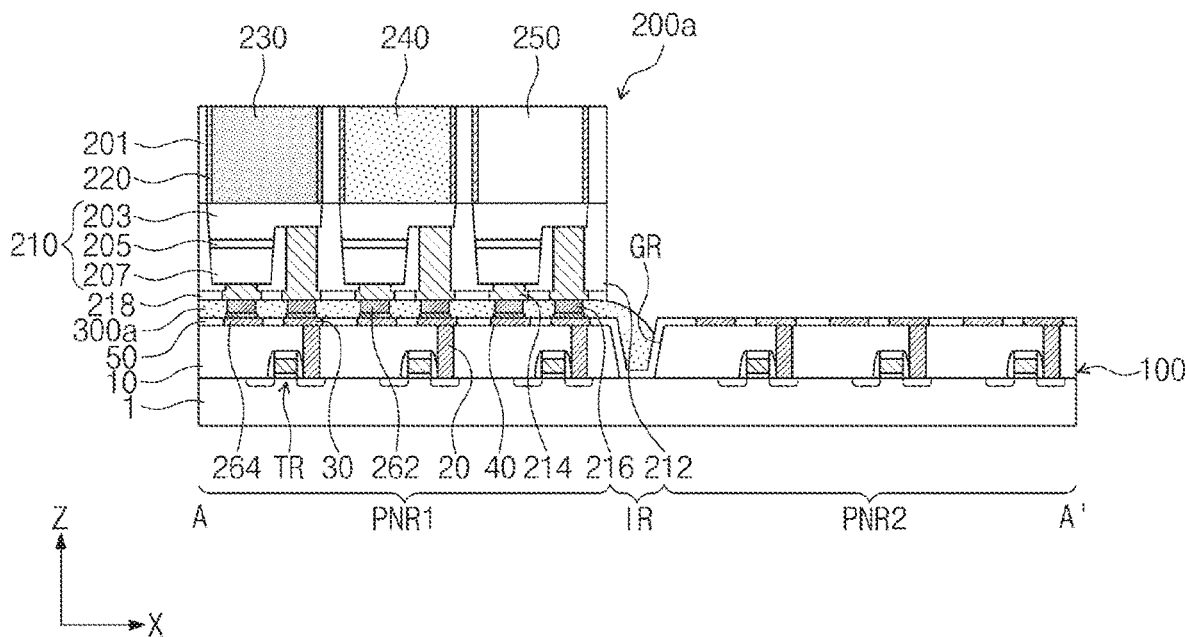

FIG. 8 illustrates a cross-sectional view showing a method of fabricating a display device according to one or more example embodiments. FIGS. 9 and 10 are cross-sectional views along line A-A' of FIG. 8, showing a method of fabricating a display device according to one or more example embodiments.

Referring to FIGS. 8 to 10, a first light-emitting device array substrate 200a, similar to that discussed above with reference to FIGS. 5 to 7, may be mounted on the first panel region PNR1 of the circuit board 100. The circuit board 100 may be similar to that discussed with reference to FIGS. 1 to 4. As shown in FIG. 9, a first non-conductive layer 300a may be formed on a bottom surface of the first light-emitting device array substrate 200a. The first non-conductive layer 300a may be a non-conductive film. The first non-conductive layer 300a may include thermosetting resin and flux. The first light-emitting device array substrate 200a may be positioned to allow its second connectors 264 to vertically overlap corresponding ones of the first and second conductive pads 30 and 40 of the circuit board 100. The first light-emitting device array substrate 200a may be mounted to allow its first and second array alignment keys AL1 and AL2 to respectively and vertically overlap the first and second circuit alignment keys AM1 and AM2 of the first panel region PNR1 (see FIG. 18).

When a thermal compression process is performed to provide heat and pressure, the second connectors 264 may be bonded to the first and second conductive pads 30 and 40, and the first non-conductive layer 300a may be melted to fill spaces between the first connectors 262 and between the second connectors 264. The flux contained in the first non-conductive layer 300a may remove metal oxide layers that can be formed on surfaces of the second connectors 264. The first non-conductive layer 300a may be cured. When the thermal compression process is carried out, the first non-conductive layer 300a may be melted to protrude outside the first panel region PNR1. A portion of the first non-conductive layer 300a may enter the groove GR. If the groove GR is absent, the first non-conductive layer 300a may invade the second panel region PNR2 and the fourth panel region PNR4 that neighbor the first panel region PNR1. In this case, a process failure may occur when other light-emitting device array substrates are subsequently mounted on the second panel region PNR2 and the fourth panel region PNR4. However, according to example embodiments, the groove GR may prevent the process failure mentioned above.

Figure 11:
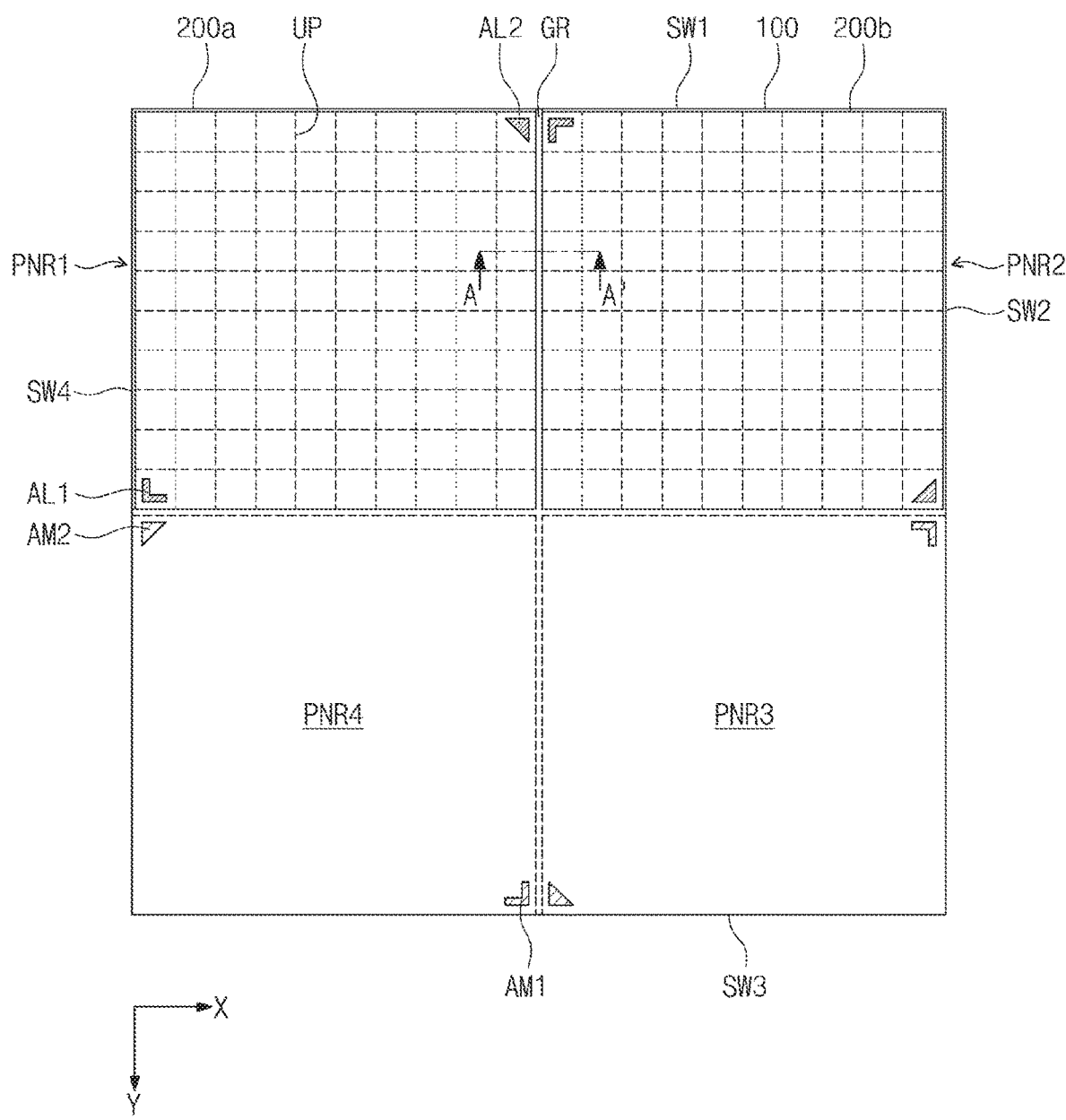
FIG. 11 illustrates a cross-sectional view showing a method of fabricating a display device according to one or more example embodiments.
Figure 12:
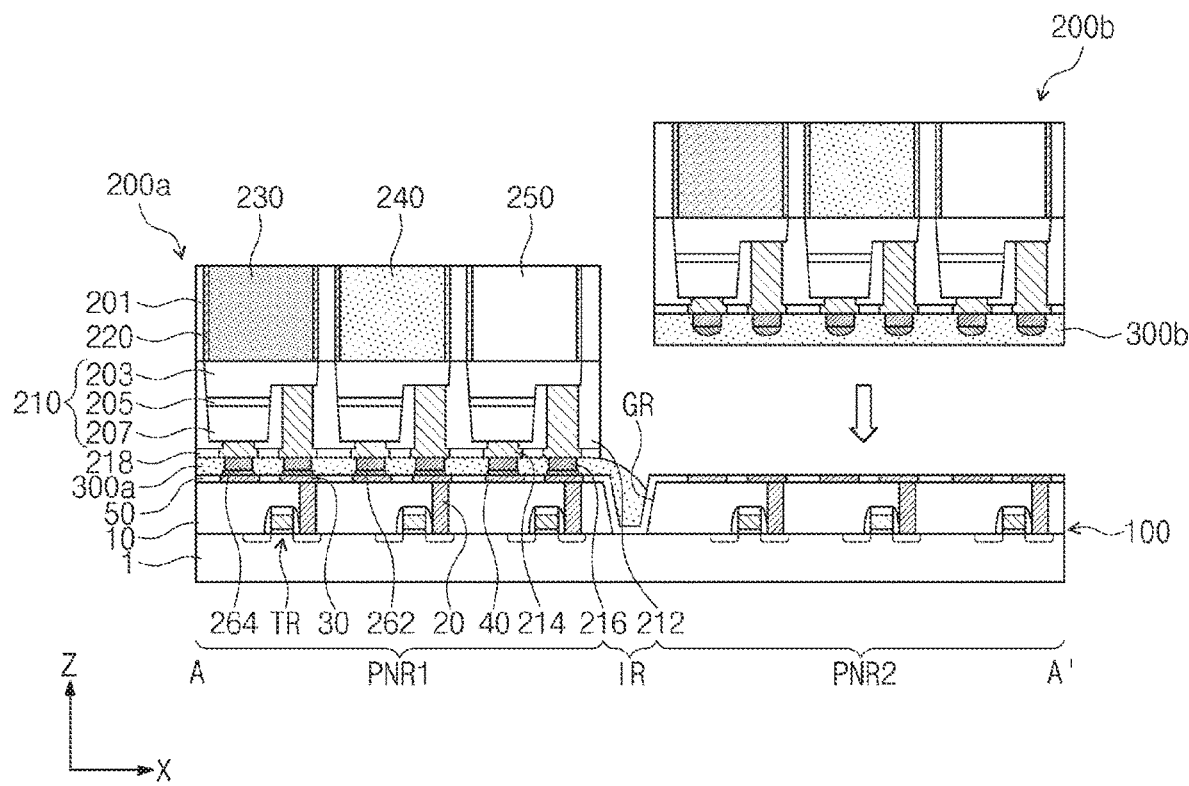
FIGS. 12 and 13 illustrate cross-sectional views showing a method of fabricating a display device according to one or more example embodiments.
Figure 13:
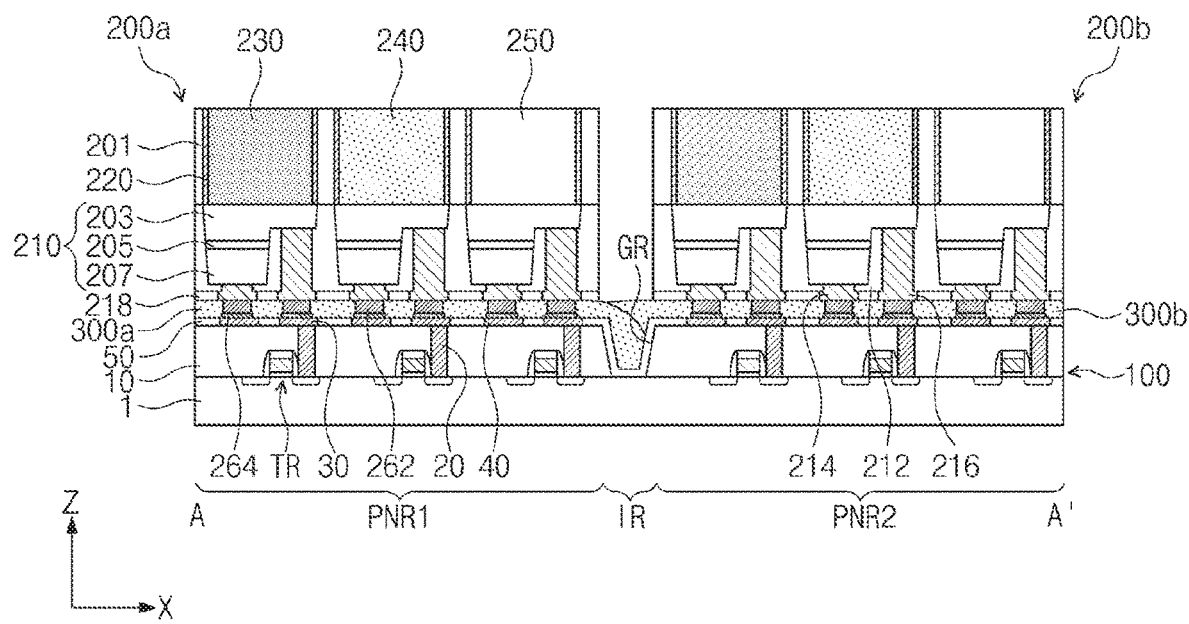

FIG. 11 illustrates a cross-sectional view showing a method of fabricating a display device according to one or more example embodiments. FIGS. 12 and 13 illustrate cross-sectional views showing a method of fabricating a display device according to one or more example embodiments.

Referring to FIGS. 11 to 13, after the first light-emitting device array substrate 200a is mounted, a second light-emitting device array substrate 200b may be mounted on the second panel region PNR2 of the circuit board 100. The second light-emitting device array substrate 200b may be identical to (or similar to) the first light-emitting device array substrate 200a. A second non-conductive layer 300b may be formed on a bottom surface of the second light-emitting device array substrate 200b. A thermal compression process, as discussed above, may be performed again. When the thermal compression process is performed, the second non-conductive layer 300b may be melted, and an upper portion of the groove GR may be filled.

Figure 14:
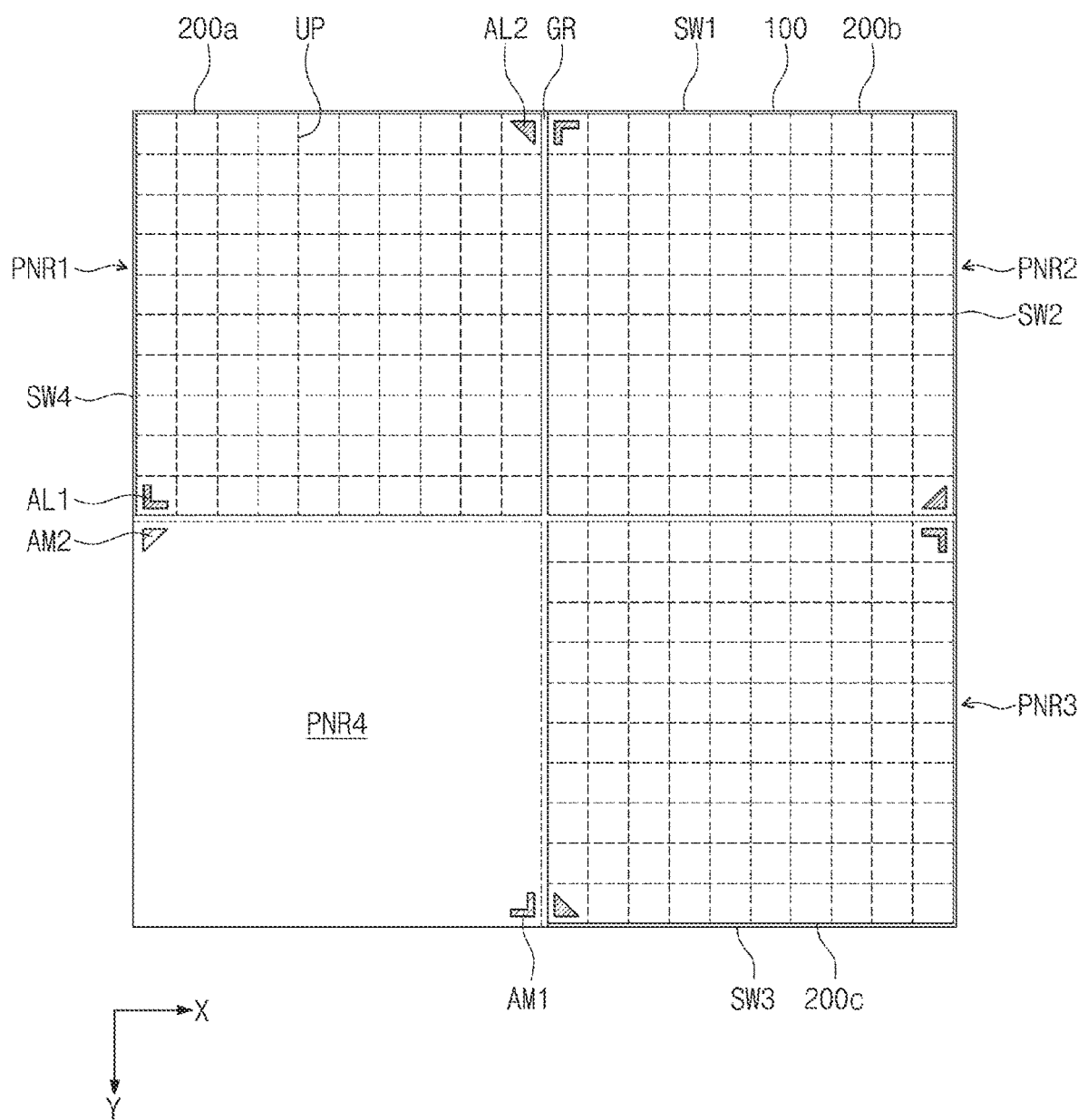
FIGS. 14 and 15 illustrate cross-sectional views showing a method of fabricating a display device according to one or more example embodiments.
Figure 15:
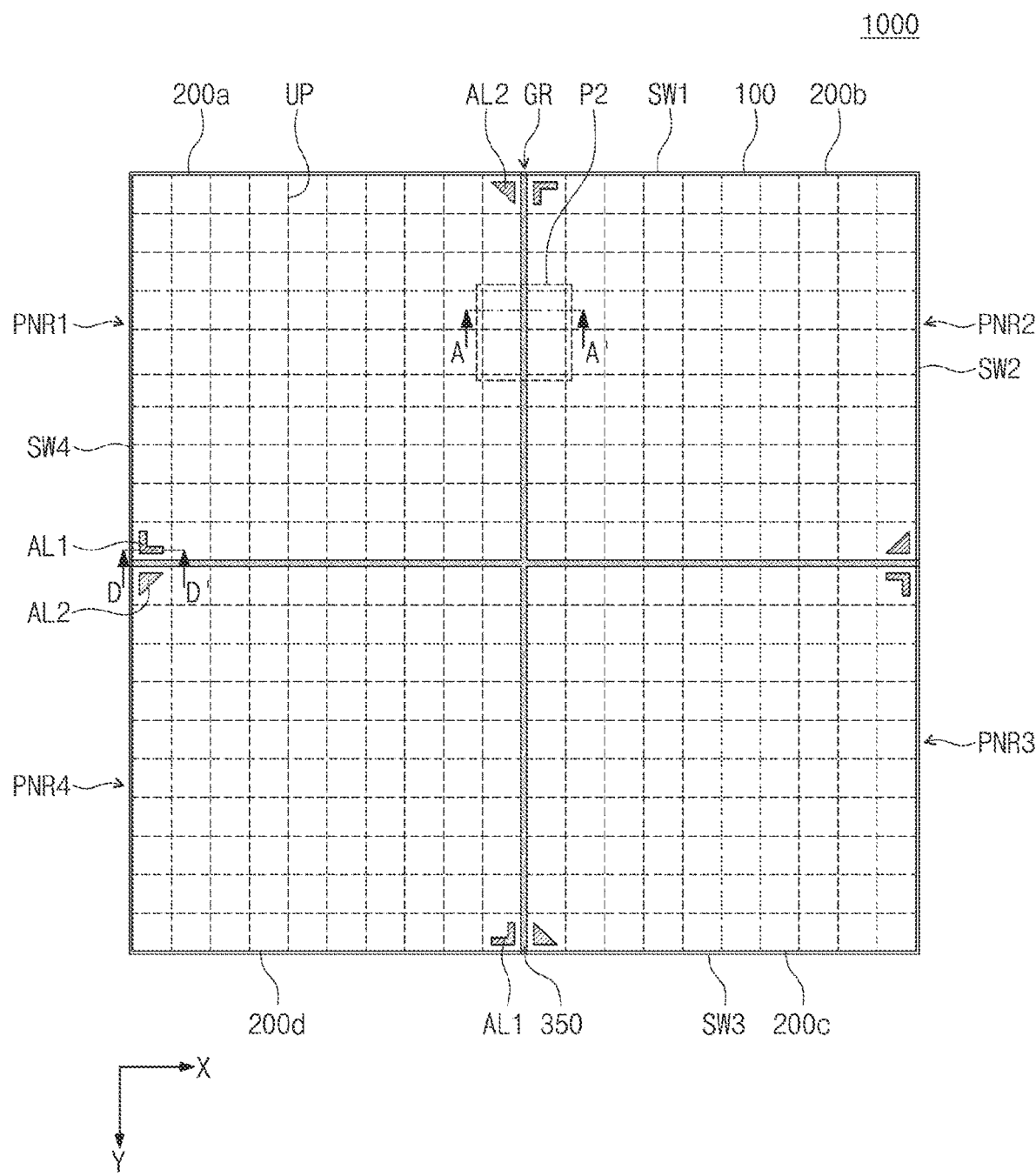
Figure 16:
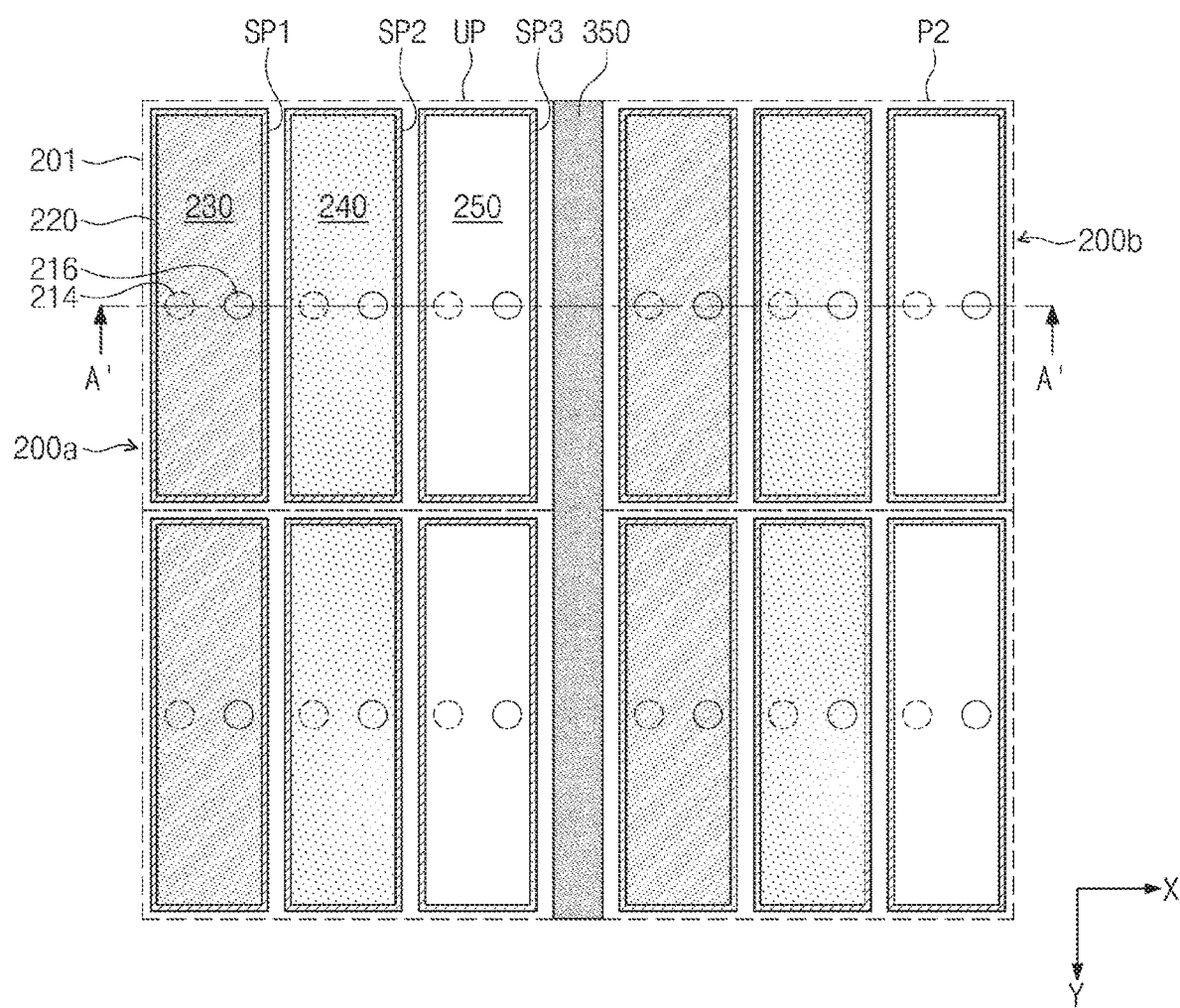
FIG. 16 illustrates an enlarged view showing section P2 of FIG. 15.
Figure 17:
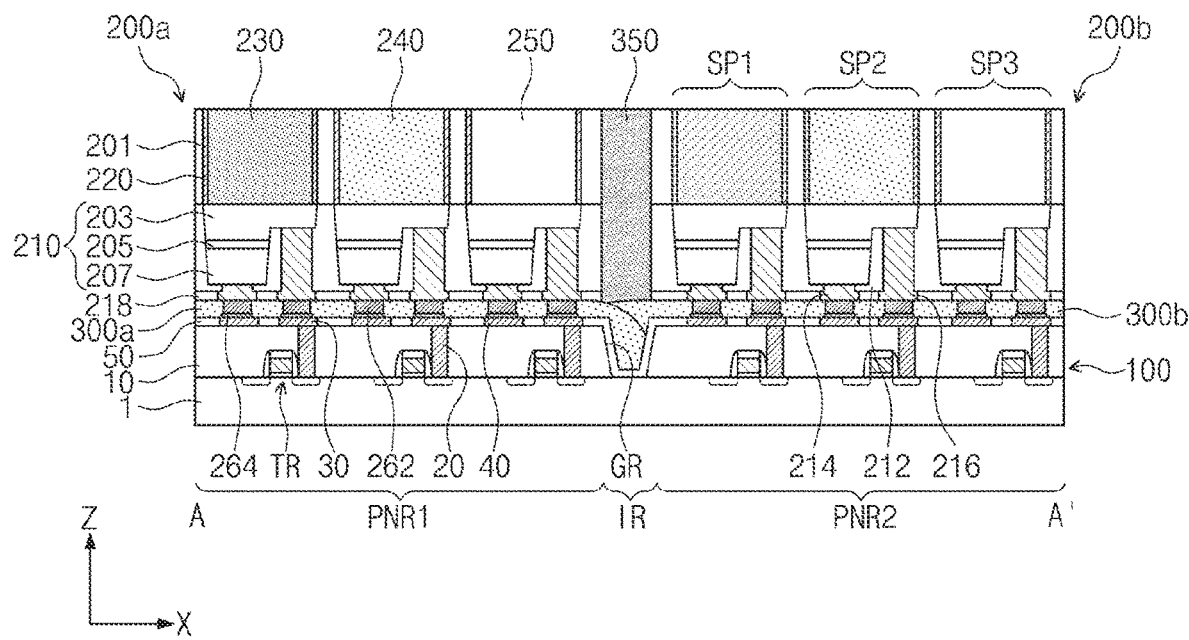
FIG. 17 illustrates a cross-sectional view along line A-A' of FIG. 15 or 16.
Figure 18:
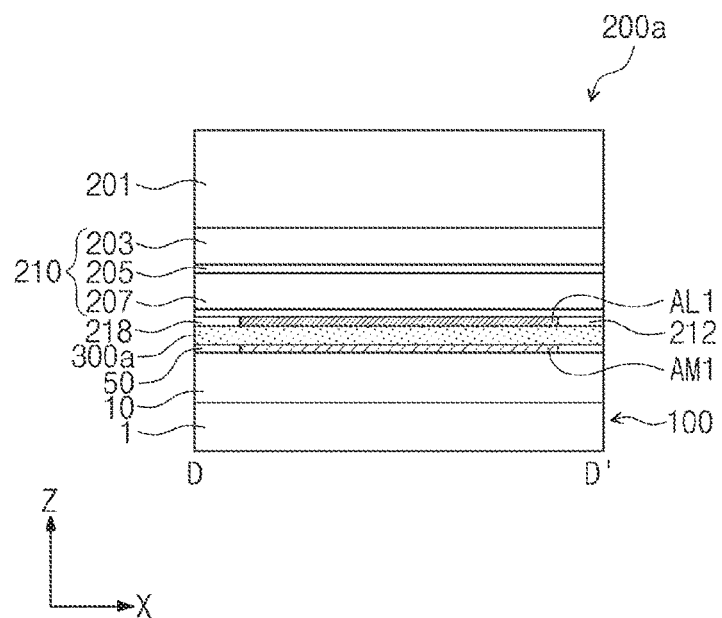
FIG. 18 illustrates a cross-sectional view along line D-D' of FIG. 15.

FIGS. 14 and 15 illustrate cross-sectional views showing a method of fabricating a display device according to one or more example embodiments. FIG. 16 illustrates an enlarged view showing section P2 of FIG. 15. FIG. 17 illustrates a cross-sectional view along line A-A' of FIG. 15 or 16. FIG. 18 illustrates a cross-sectional view along line D-D' of FIG. 15.

Referring to FIGS. 14 to 18, identically to (or similarly to) that discussed above, a third light-emitting device array substrate 200c may be mounted on the third panel region PNR3 of the circuit board 100. The third light-emitting device array substrate 200c may be identical to (or similar to) the first light-emitting device array substrate 200a. A fourth light-emitting device array substrate 200d may be mounted on the fourth panel region PNR4 of the circuit board 100. The fourth light-emitting device array substrate 200d may be identical to (or similar to) the first light-emitting device array substrate 200a. A non-conductive layer may be interposed between the circuit board 100 and the third light-emitting device array substrate 200c, and between the circuit board 100 and the fourth light-emitting device array substrate 200d. Therefore, the groove GR may be filled with the non-conductive layer.

Subsequently, on the boundary IR, a protective layer 350 may be formed in a space between the first to fourth light-emitting device array substrates 200a to 200d. The protective layer 350 may have a top surface coplanar with those of the first to fourth light-emitting device array substrates 200a to 200d. The protective layer 350 may serve to bond the first to fourth light-emitting device array substrates 200a to 200d to each other and may also serve to prevent external moisture from entering. The protective layer 350 may be formed of, for example, polyimide. The protective layer 350 may include, for example, a black pigment or die. The protective layer 350 may contact one or more of the first and second non-conductive layers 300a and 300b.

Through the processes mentioned above, a display device 1000 may be fabricated. The first array alignment keys AL1 may vertically overlap the first circuit alignment keys AM1, and the second alignment keys AL2 may vertically overlap the second circuit alignment keys AM2.

The display device 1000 may have a structure in which four light-emitting device array substrates 200a to 200d are mounted on the circuit board 100 and the non-conductive layers 300a and 300b are interposed between the circuit board 100 and the light-emitting device array substrates 200a to 200d. The circuit board 100 may have the groove GR formed to overlap a boundary between the light-emitting device array substrates 200a to 200d, and the non-conductive layers 300a and 300b may fill the groove GR when the light-emitting device array substrates 200a to 200d are bonded to the circuit board 100. The groove GR may have a cross shape when viewed in plan. The groove GR may have a width that varies. In the display device 1000, the first-conductivity semiconductor layers 203 may be electrically connected to corresponding transistors TR. The second-conductivity semiconductor layers 207 may be supplied with a ground voltage.

The first array alignment keys AL1 and the second array alignment keys AL2 may be positioned along the perimeter of the display device. For example, the first array alignment keys AL1 and the second array alignment keys AL2 not be positioned on a central area of the display device 1000. As such, pixel loss at the central area may be reduced, and sharp images may be generated by the display device 1000.

According to one or more example embodiments, because the circuit board 100 has the groove GR formed thereon, a process failure may not occur during a thermal compression process and the first to fourth light-emitting device array substrates 200a to 200d may be exactly mounted. In conclusion, the display device 1000 may be produced with decreased failure and increased reliability.

The display device 1000 may be referred to as a micro-LED display device. In one or more example embodiments, the light-emitting device array substrates 200a to 200d may be mounted sequentially along a clockwise direction on the circuit board 100, but the sequence of mounting may be changed. For example, the light-emitting device array substrates 200a to 200d may be mounted along a counterclockwise direction or along random directions. Alternatively, the first and third light-emitting device array substrates 200a and 200c may be simultaneously mounted on the first and third panel regions PNR1 and PNR3 that are diagonally positioned.

In one or more example embodiments, four light-emitting device array substrates 200a to 200d are mounted on a single circuit board 100, but it will be apparent that example embodiments can be applied to the case where more or less than four light-emitting device array substrates are mounted on a single circuit board 100.

Figure 19:
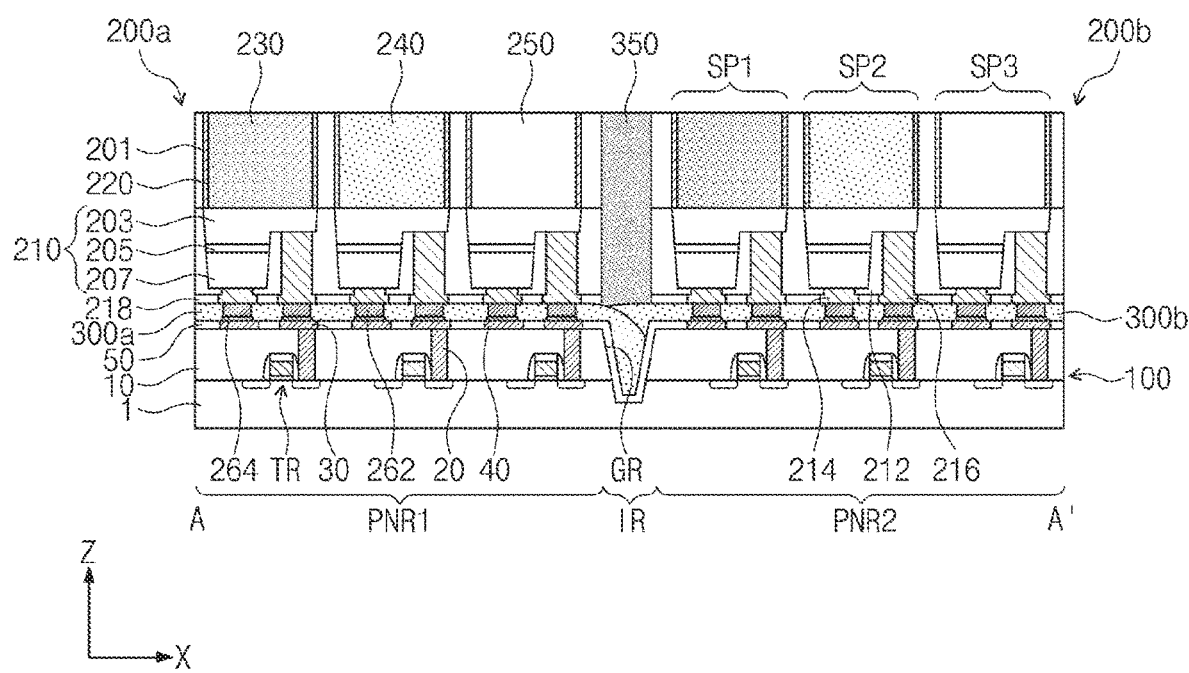
FIG. 19 illustrates a cross-sectional view along line A-A' of FIG. 15 or 16.

FIG. 19 illustrates a cross-sectional view along line A-A' of FIG. 15 or 16.

Referring to FIG. 19, on the circuit board 100, a portion of the groove GR may be formed in the base layer 1. The first passivation layer 50 may cover a sidewall and a bottom surface of the groove GR formed in the base layer 1. In this case, the groove GR may increase in volume, and it may thus be more effective in reducing defects caused by a non-conductive layer when a thermal compression process is performed. Other configurations and processes may be identical to (or similar to) those discussed above.

Figure 20:
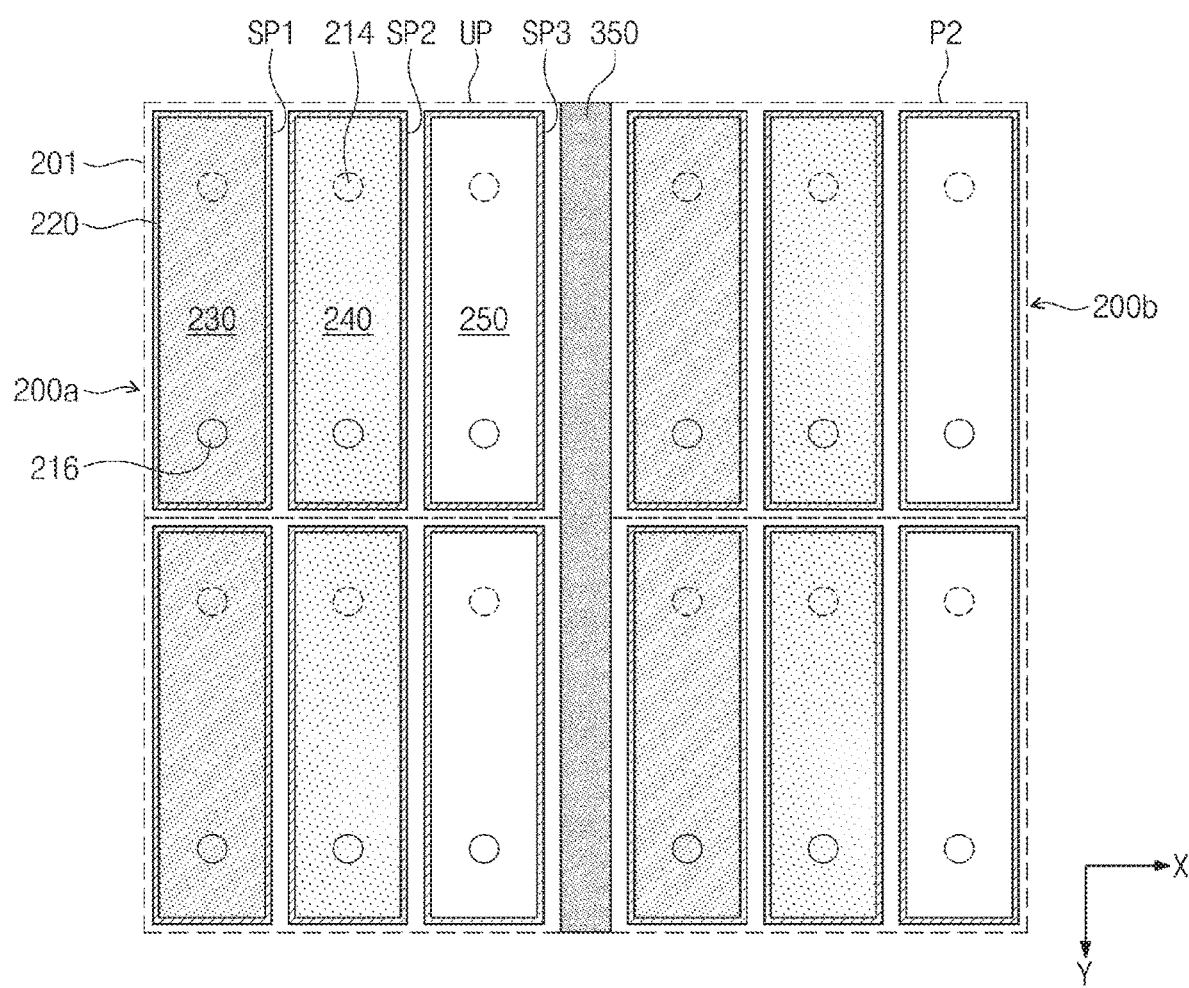
FIG. 20 illustrates an enlarged view showing section P2 of FIG. 15.
Figure 21:
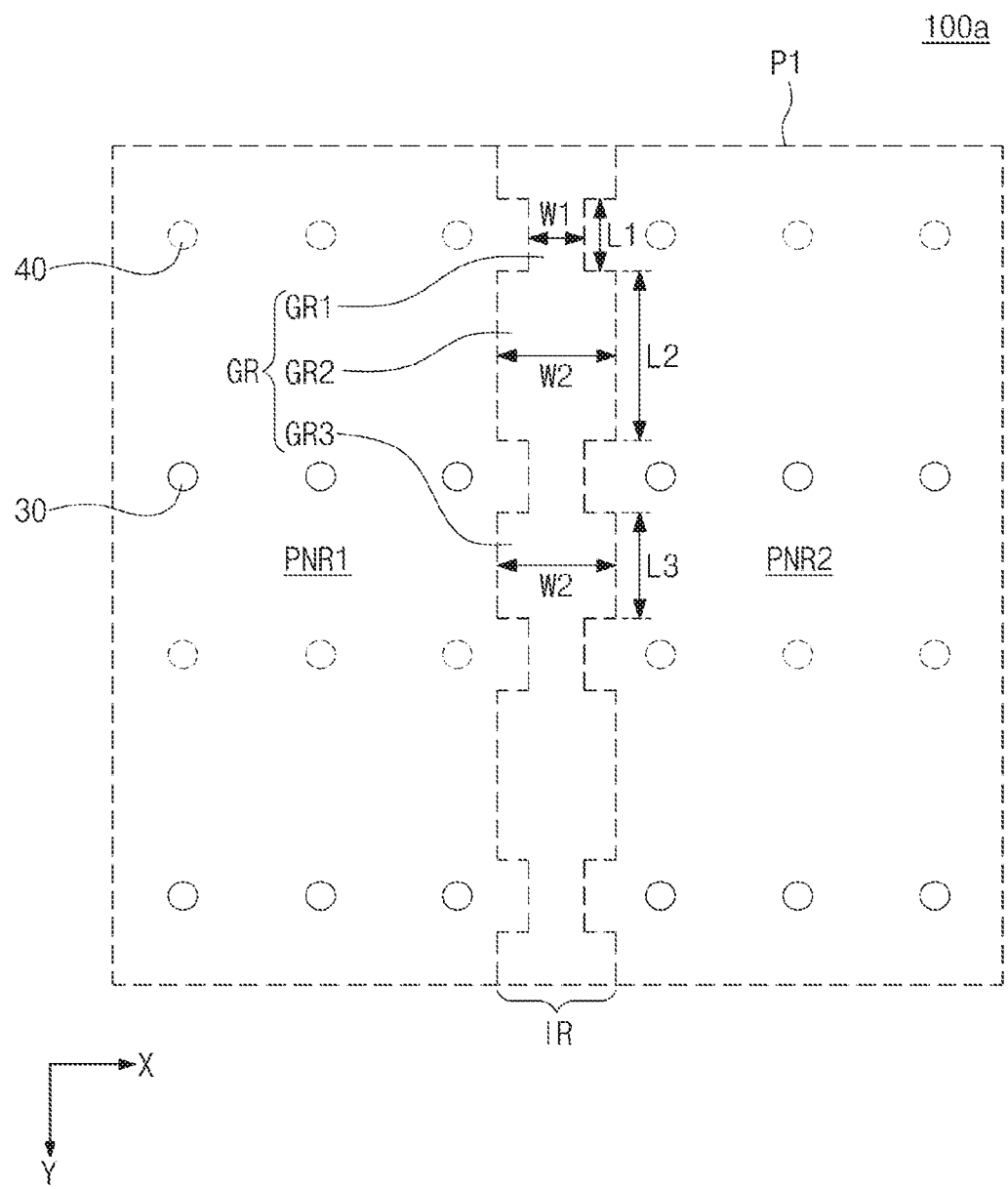
FIG. 21 illustrates an enlarged view showing section P1 of FIG. 1.

FIG. 20 illustrates an enlarged view showing section P2 of FIG. 15. FIG. 21 illustrates an enlarged view showing section P1 of FIG. 1.

Referring to FIGS. 20 and 21, a display device according to one or more example embodiments may include the light-emitting device array substrates 200a to 200d whose first and second electrodes 216 and 214 are arranged differently from that shown in FIG. 16. The display device may include a circuit board 100a of which first and second conductive pads 30 and 40 are arranged differently from that shown in FIG. 2. The first electrodes 216 may be linearly arranged along the first direction X. The second electrodes 214 may be linearly arranged along the first direction X. The first electrodes 216 may be spaced apart, in the second direction Y, from the second electrodes 214. The first conductive pads 30 may be disposed to vertically overlap the first electrodes 216. The second conductive pads 40 may be disposed to vertically overlap the second electrodes 214. The first electrode 216 and the first conductive pad 30 may be provided therebetween with the first and second connectors (see 262 and 264 of FIG. 17) that are disposed to also vertically overlap the first electrode 216, and the second electrode 214 and the second conductive pad 40 may be provided therebetween with the first and second connectors (see 262 and 264 of FIG. 17) that also vertically overlap the second electrode 214.

The groove GR may have a planar shape different from that shown in FIG. 2. The groove GR may include a first groove GR1, a second groove GR2, and a third groove GR3. The first groove GR1 may be positioned between neighboring first conductive pads 30 and between neighboring second conductive pads 40. The first groove GR1 may have a first width W1 parallel to the first direction X and a first length L1 parallel to the second direction Y. The second and third grooves GR2 and GR3 may be alternately disposed along the second direction Y across the first groove GR1. Each of the second and third grooves GR2 and GR3 may have a second width W2 greater than the first width W1. The second groove GR2 may have a second length L2 greater than the first length L1. The third groove GR3 may have a third length L3 greater than the first length L1 and less than the second length L2.

The groove GR may have a depth that varies, and is different at various positions. The groove GR may have a planar shape that varies at different positions. Although FIGS. 2 and 21 each show a detailed planar shape of the groove GR between the first panel region PNR1 and the second panel region PNR2, this configuration is not limited to between the first and second panel regions PNR1 and PNR2. That is, the configuration may also be applicable to grooves between other panel regions of the first to fourth panel regions PNR1 to PNR4.

Figure 22:
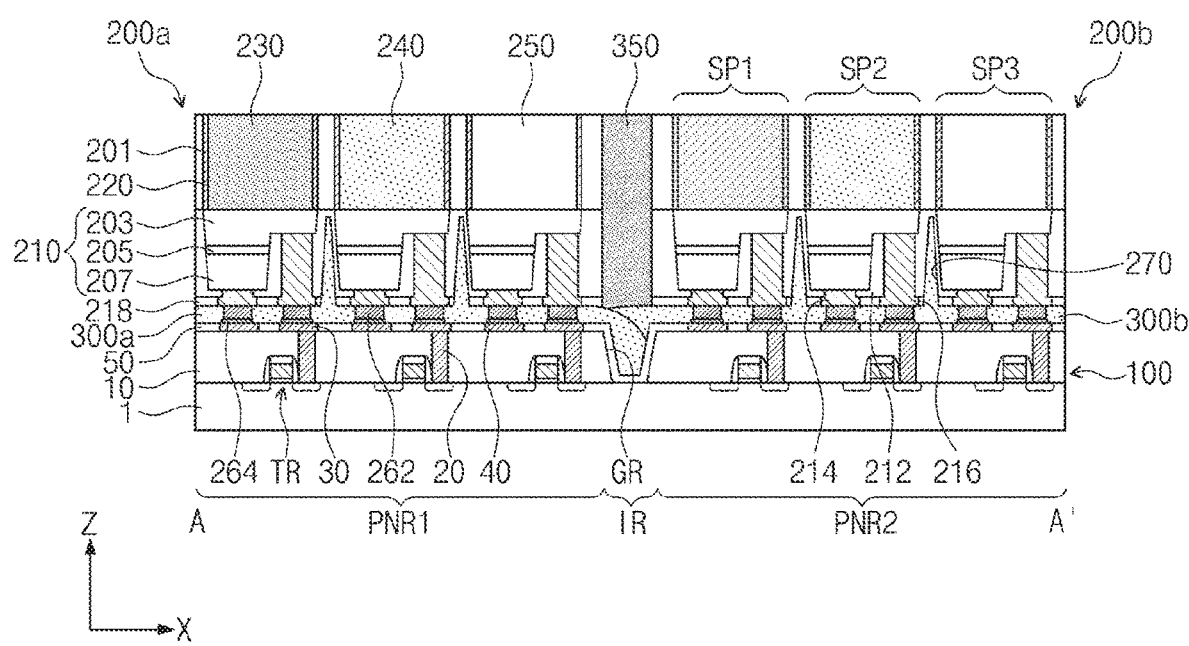
FIG. 22 illustrates a cross-sectional view along line A-A' of FIG. 15 or 16.

FIG. 22 illustrates a cross-sectional view along line A-A' of FIG. 15 or 16.

Referring to FIG. 22, a display device may include the light-emitting device array substrates 200a and 200b in which recessions 270 are formed on corresponding isolation dielectric patterns 212. The first and second non-conductive layers 300a and 300b may be partially inserted into the recessions 270. The recessions 270 may provide the light-emitting device array substrates 200a and 200b with additional spaces that prevent the first and second non-conductive layers 300a and 300b from invading neighboring panel regions.

According to one or more example embodiments, a display device may include a circuit board on which a groove is formed, which may result in an increase in reliability.

According to example embodiments, a circuit board on which a groove is formed may be used to fabricate a display device, which may result in a decreased failure rate and an increased yield.

While aspects of example embodiments have been described and illustrated in the accompanying drawings, it will be understood to those skilled in the art that various changes and modifications may be made without departing from the technical spirit and essential feature of the present disclosure. It will be apparent to those skilled in the art that various substitution, modifications, and changes may be thereto without departing from the scope and spirit of the present disclosure.

What is claimed is:

1. A display device, comprising:
a circuit board;
a first light-emitting device array substrate mounted on the circuit board; and
a second light-emitting device array substrate mounted on the circuit board adjacent the first light-emitting device array substrate in a first direction,
wherein the circuit board defines a groove that overlaps a boundary between the first light-emitting device array substrate and the second light-emitting device array substrate.

2. The display device of claim 1, further comprising a third light-emitting device array substrate mounted on the circuit board adjacent the second light-emitting device array substrate in a second direction, wherein the second direction intersects the first direction; and
a fourth light-emitting device array substrate mounted on the circuit board adjacent the first light-emitting device array substrate in the second direction,
wherein the groove has a cross shape when viewed in plan.

3. The display device of claim 1, wherein a width of the groove varies.

4. The display device of claim 1, wherein the circuit board comprises a plurality of first circuit alignment keys and a plurality of second circuit alignment keys, and
wherein the plurality of first circuit alignment keys and the plurality of second circuit alignment keys are disposed along a perimeter of the circuit board.

5. The display device of claim 4, wherein one of the plurality of first circuit alignment keys and one of the plurality of second circuit alignment keys are adjacent to each other and are disposed close to a center of a lateral side of the circuit board.

6. The display device of claim 1, wherein the first light-emitting device array substrate comprises:
a plurality of light-emitting stacks spaced apart from each other in the first direction; and
an isolation dielectric pattern interposed between each of the plurality of light-emitting stacks,
wherein the isolation dielectric pattern comprises a recession.

7. The display device of claim 1, wherein the circuit board comprises a base layer and an interlayer dielectric layer covering the base layer, and
wherein the groove is provided in the interlayer dielectric layer.

8. The display device of claim 1, further comprising a non-conductive layer interposed between the circuit board and each of the first light-emitting device array substrate and the second light-emitting device array substrate, and
wherein the non-conductive layer is provided within the groove.

9. A display device, comprising:
a base substrate;
a first substrate mounted on the base substrate; and
a second substrate mounted on the base substrate, wherein the first substrate and the second substrate are linearly disposed along a first direction,
wherein the base substrate defines a groove that overlaps a boundary between the first substrate and the second substrate.

10. The display device of claim 9, further comprising:
a third substrate mounted on the base substrate; and
a fourth substrate mounted on the base substrate,
wherein the first substrate, the second substrate, the third substrate and the fourth substrate are sequentially arranged on the base substrate alone a clockwise direction, and
wherein the groove has a cross shape when viewed in plan.

11. The display device of claim 9, wherein a width of the groove varies.

12. The display device of claim 9, wherein the base substrate comprises a plurality of first alignment keys and a plurality of second alignment keys,
wherein the plurality of first alignment keys and the plurality of second alignment keys are disposed along a perimeter of the base substrate.

13. The display device of claim 12, wherein first shapes of the plurality of first alignment keys are different from second shapes of the plurality of second alignment keys.

14. The display device of claim 12, wherein one of the plurality of first alignment keys and one of the plurality of second alignment keys are adjacent to each other and are disposed close to a center of a lateral side of the base substrate.

15. The display device of claim 9, wherein the base substrate comprises a base layer and an interlayer dielectric layer that covers the base layer, and
wherein the groove is provided in the interlayer dielectric layer.

16. The display device of claim 9, further comprising a non-conductive layer interposed between the base substrate and each of the first substrate and the second substrate, and
wherein the non-conductive layer is provided within the groove.

17. A display device, comprising:
a circuit board;
a first light-emitting device array substrate that is flip-chip mounted on the circuit board;
a second light-emitting device array substrate that is flip-chip mounted on the circuit board, wherein the first light-emitting device array substrate and the second light-emitting device array substrate are linearly disposed along a first direction; and
a non-conductive layer interposed between the circuit board and each of the first light-emitting device array substrate and the second light-emitting device array substrate,
wherein the circuit board defines a groove that overlaps a boundary between the first light-emitting device array substrate and the second light-emitting device array substrate, and
wherein the non-conductive layer is provided within the groove.

18. The display device of claim 17, further comprising:
a third light-emitting device array substrate mounted on the circuit board; and
a fourth light-emitting device array substrate mounted on the circuit board,
wherein the third light-emitting device array substrate and the fourth light-emitting device array substrate are linearly disposed along the first direction,
wherein the third light-emitting device array substrate is adjacent to the second light-emitting device array substrate along a second direction, wherein the second direction intersects the first direction,
wherein the fourth light-emitting device array substrate is adjacent to the first light-emitting device array substrate along the second direction, and
wherein the groove has a cross shape when viewed in plan.

19. The display device of claim 17, wherein a width of the groove varies.

20. The display device of claim 17, wherein the circuit board comprises a plurality of first circuit alignment keys and a plurality of second circuit alignment keys,
wherein the plurality of first circuit alignment keys and the plurality of second circuit alignment keys disposed along a perimeter of the circuit board.

* * * * *